April 26, 1966 A. H. B. WALKER 3,248,598

DEFLECTION CIRCUIT

Filed Dec. 3, 1962 3 Sheets-Sheet 1

WITNESSES:

Bernard R. Giegue

James F. Young

INVENTOR
Alec H.B. Walker

BY Francis E. Blake
ATTORNEY

DEFLECTION CIRCUIT

Filed Dec. 3, 1962 3 Sheets-Sheet 2

United States Patent Office 3,248,598
Patented Apr. 26, 1966

3,248,598

DEFLECTION CIRCUIT

Alec H. B. Walker, Trafford, Pa., assignor to Westinghouse Electric Corporation, Pittsburgh, Pa., a corporation of Pennsylvania Filed Dec. 3, 1962, Ser. No. 241,643
10 Claims. (Cl. 315—27)

The present invention relates to deflection circuits and more particularly to circuits for producing a periodic linear change in current in a deflection coil of a television receiver or the like.

The present availability of solid state switching devices such as diodes, transistors, and controlled rectifiers have encouraged the production of television receivers having all solid state devices in place of thermionic tubes and the like. The deflection circuits using solid state switching devices are difficult to construct in view of the relatively high voltages and currents imposed on the solid state switching devices during their operation. The more conventional silicon controlled rectifiers, for example, are readily turned on to become conductive by the application of suitable drive voltage pulses to the control element thereof, but such rectifiers cannot ordinarily be turned off to be made non-conductive except by the reduction of current therethrough below the holding current value or by reversal of the current to be passed therethrough.

It is a principal object of the present invention to provide an improved form of deflection circuit that enables the use of a conventional silicon controlled rectifier or the like in the operation thereof.

In accordance with the invention, a deflection coil is connected in series with a solid state diode to a source of direct current and a solid state controlled rectifier which may be of the silicon controlled rectifier type is connected in series with a flyback capacitor and in parallel with the deflection coil. The polarities of the connections of the controlled rectifier and the diode in series with the source of direct current are opposite to each other and are such as to enable the flyback capacitor to be discharged through the controlled rectifier and the deflection coil when the controlled rectifier is triggered to conduction by a suitable polarity and voltage drive pulse at the beginning of the retrace current interval. Thereafter the diode whose polarity of connection is opposite to that of the controlled rectifier becomes conductive when the current through the deflection coil starts to linearly decline at the beginning of the trace current interval thereby clamping the deflection coil to the source of direct current. An oscillatory circuit and a non-oscillatory circuit are so connected to the direct current source and each other together with the controlled rectifier as to superimpose their currents on the controlled rectifier in a manner to reduce the current through the controlled rectifier below its holding current value to thereby cause the controlled rectifier to become non-conductive during the linear trace current interval of current flow through the deflection coil and diode. The sum currents through the oscillatory and non-oscillatory circuits are also effective to maintain the controlled rectifier non-conductive immediately after it has turned off and to enhance the linearity of the trace current flow through the deflection coil and diode during the remainder of the trace current interval.

Further objects, features and the attending advantages of the invention will be apparent with reference to the following specification and drawings in which.

Figure 1:
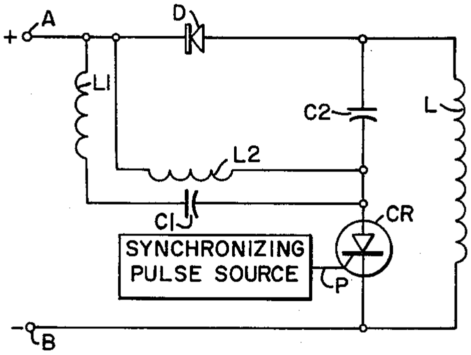
FIGURE 1 is a schematic wiring diagram of the basic form of the invention.

Referring to FIG. 1, it is assumed in the following that the circuit arrangement shown therein constitutes a horizontal line scanning or deflection circuit for a television receiver, the scanning and deflection coil of the receiver being represented by the inductance L. Direct current supply terminals A and B are connected to the positive and negative terminals respectively of a source of direct current in the receiver which is not shown. Terminal A is connected to one terminal of an inductance L1 and of a further inductance L2. The other terminal of L1 is connected via a capacitor C1 to the other terminal of L2. The junction of C1 and L2 is connected to the junction of a capacitor C2 and a controllable rectifier device CR, which are connected in series across the terminals of the scanning or deflection coil L. One terminal of L is connected via a clamping diode D to the terminal A and the other terminal of L is connected directly to the negative supply terminal B. The controllable rectifier device CR is a semiconductor controllable rectifier device of the type such as a silicon controlled rectifier which is rendered conducting on application thereto of a triggering signal of appropriate polarity at the triggering terminal P, and is rendered non-conducting when the current therein tends to reverse.

Figures 8A, 8B, 8C, 8D, 8E, 8F, 8G, 8H:
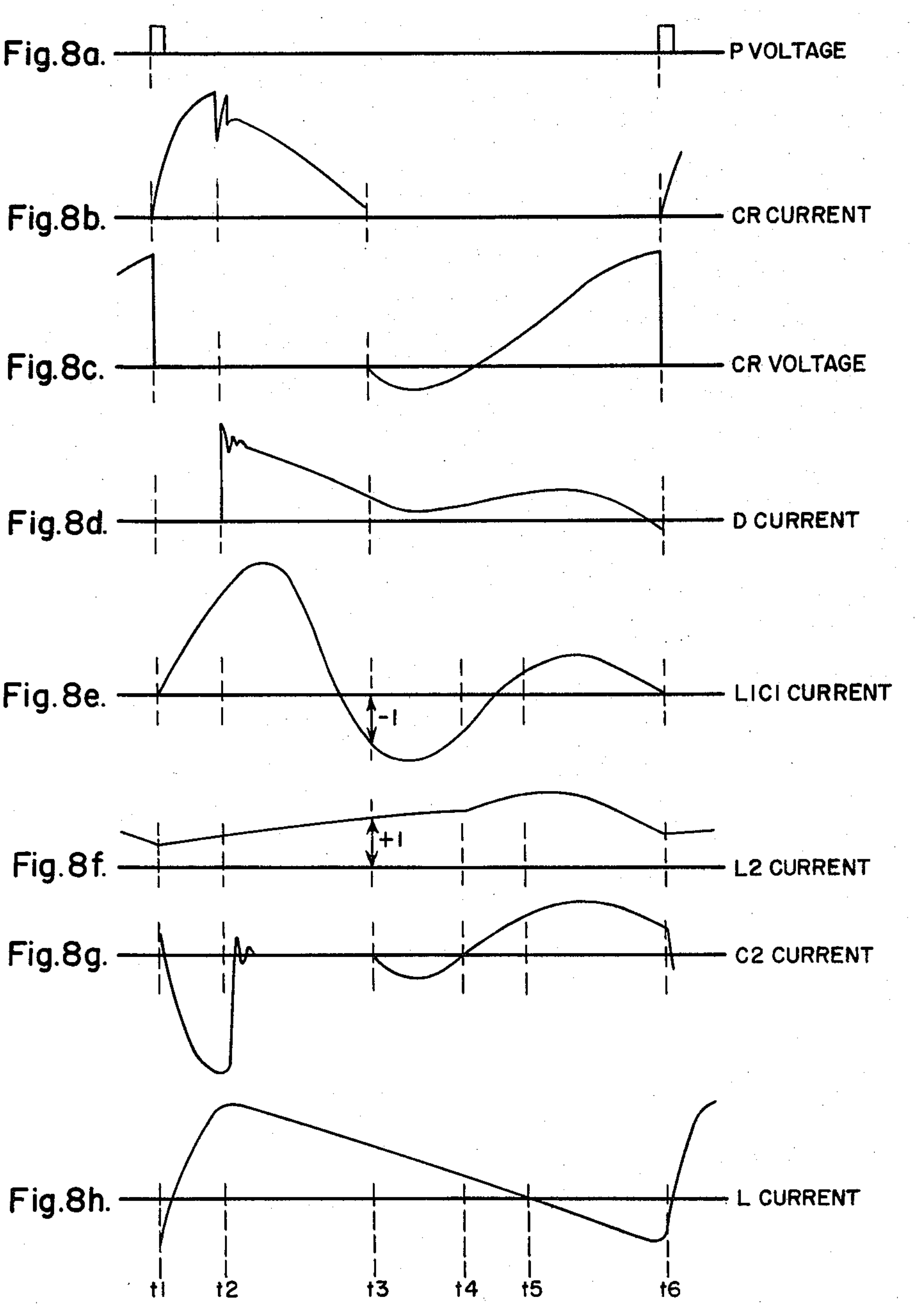
FIGS. 8*a* through 8*h* are a family of wave form curves to show the operation of the circuit of FIG. 1.

In describing the mode of operation of the circuit arrangement shown in FIG. 1, reference will be made to the graphical illustrations of FIGS. 8*a* through 8*h* which illustrate the development of a complete scanning cycle for the horizontal line scan of a television receiver. Thus FIG. 8*a* illustrates the voltage of triggering signal for the controllable rectifier CR, FIG. 8*b* illustrates the anode current in the controllable rectifier CR, FIG. 8*c* illustrates the voltage across the controllable rectifier, FIG. 8*d* illustrates the current in the diode D, FIG. 8*e* illustrates the current in the path comprising L1 and C1, FIG. 8*f* illustrates the current in the path through L2, FIG. 8*g* illustrates the current in the capacitor C2 and FIG. 8*h* illustrates the actual deflection current in the inductive deflection coil L. The time scale in the cycle of operations will be taken to start at a time *t*1 when the spot on the cathode ray tube is assumed to be deflected to the extreme right-hand side of the screen and at the beginning of the retrace current interval. Under these conditions a maximum negative current is flowing in L. At this time furthermore, the capacitor C2 is charged to a maximum high voltage which may be of the order of say 500 volts or about 10 times the direct current supply voltage. The manner in which C2 becomes charged to this voltage will be appreciated hereafter. Thus the controllable rectifier device CR has its upper or anode electrode at a high potential which is positive with respect to ground as may be seen by FIG. 8*c*. At this instant it is arranged that the controllable rectifier device CR is rendered conducting by a triggering current pulse to the terminal P from the synchronizing circuit arrangement of the receiver (not shown) and the current in the deflection coil L therefore rapidly reverses during the retrace interval and builds up to a peak value through the controllable rectifier as shown by FIG. 8*b*. It will be appreciated that since the deflection coil L is inductive, the condition pertaining at this time is an oscillatory conditon and the frequency of the oscllation is determined by the value of LC2. At the end of one-quarter of a cycle of the oscillation, time *t2* and the beginning of the trace current interval, the voltage across L reverses and the upper end of the yoke L begins to move positively with respect to ground terminal B because of having been driven, say, several hundred volts negative when CR was rendered conducting. Also, at the time *t2*, as soon as voltage across L slightly exceeds the supply voltage, the voltage across L is clamped to the supply voltage by the diode D and the current in L commences a linear decay as trace current via D, the decay current being determined by the relationship $$L\frac{di}{dt}=V_{DC}$$

(the drop in D and resistive losses). The commutation of current in L from the path through C2 to the path through D is normally accompanied by several transient oscillations which may be damped if desired by providing some extra resistances in series with D or C2. The initiation of current in D at this instant is shown by FIG. 8*d* and the buildup and cessation of current in C2 is illustrated by FIG. 8*g*.

Referring again to the instant *t1* at the beginning of the retrace current interval, when the controllable rectifier CR is rendered conducting, two other currents are determined by the switching-on action of CR. Firstly, a current in L2, which for purposes of this description may be termed a non-oscillatory circuit and is a relatively large inductance, which was previously falling as it charged up the capacitor C2, commences a linear increase, since the fact that the controllable rectifier CR is conducting means that L2 is connected directly across the D.C. supply. Secondly, a current in the oscillatory circuit comprising the series connected L1 and C1 through the controllable rectifier CR builds up rapidly to an oscillatory positive maximum followed by a decrease and reversal at its natural frequency determined by L1C1.

Whilst this action proceeds the deflection coil L carries the regenerative current which is continuously linearly decreasing through diode D and this decreasing current is completely unaffected by the currents in L1C1 or L2, since the only coupling between the scanning current and the latter two currents at this time is via the source of direct current, whose impedance is relatively very low.

Considering now the instant *t3* during the trace current interval, which is an instant after the current in the oscillatory circuit L1C1 has commenced its first reverse half-cycle after the beginning of the retrace current interval time *t1* and is building up in a negative direction as shown by FIG. 8*c*, while the current in the non-oscillatory circuit L2 is steadily increasing in a positive direction as shown by FIG. 8*f*, a time is reached when these two currents are substantially equal and mutually cancel. This instant is shown by FIGS. 8*e* and 8*f* by the point at which these currents are −I and +I and the current in the controllable rectifier CR therefore falls to zero and tends to reverse causing the controllable rectifier to be rendered non-conducting during the trace current interval. Immediately after instant *t3*, the combined current in the oscillatory circuit L1C1 and the non-oscillatory circuit L2 tends to go slightly negative, being drawn from the capacitor C2, and the voltage across the controllable rectifier CR tends to go negative so providing adequate time for the controllable rectifier CR to be rendered non-conducting without being submitted to any voltage or current transients of any substantial magnitude.

It will be appreciated that when the sum of the currents in the oscillatory circuit L1C1 and the non-oscillatory circuit L2 is drawn from the capacitor C2 this sum current subtracts from the linear current which flows in the diode D and which is being regenerated into the supply from the scanning yoke L. Thus the total current through diode D shows a slight inflection at instant *t3* as shown by FIG. 8*d*, followed by a sinusoidal dip However, so long as the linear regenerative current from deflection coil L exceeds the sum current of oscillatory circuit L1C1 and non-oscillatory circuit L2, the net current in diode D remains in the forward direction for the diode and the voltage drop across the diode is substantially unaffected. Hence the voltage across the deflection coil L remains clamped at substantially the D.C. supply voltage. Therefore, the linear rate of current variation in the coil L continues substantially undisturbed and the deflection remains linear.

Proceeding from the instant *t3*, at a somewhat later instant *t4* during the trace current interval, the sum current composed of the current in oscillatory circuit L1C1 and the current in non-oscillatory circuit L2 reverses in polarity and therefore the anode of the controllable rectifier CR begins to be driven gradually more positive but the controllable rectifier CR cannot conduct since it has already been rendered non-conducting and will not be rendered conducting until a further trigger or drive voltage pulse is applied at time *t6* corresponding to time *t1* at the beginning of the next retrace current interval. However, since the regenerative current in deflection coil L is falling and nearing zero and must actually reverse at some instant such as at time *t5* during the trace current interval, if the deflection current is to remain linear, the positive current in the diode D must be maintained by the sum of the currents in oscillatory circuit L1C1 and non-oscillatory circuit L2 flowing through capacitor C2. This current reverses as aforesaid at *t4* during the trace current interval, becoming positive through the diode D and remains positive until the end of the trace current interval. Therefore the sum current exceeds the current in deflection coil L at all times except at the extreme end of the trace current interval, so maintaining didoe D biased in the forward direction. At the extreme end of the trace current interval, diode D may actually carry a small negative or hole storage current without developing any voltage drop cross it and during the full trace current interval from time *t2* to *t6*, the voltage across deflection coil L is substantially equal to the direct current supply voltage and the deflection current therefore remains linear.

After the instant *t4* when the sum of currents through L1C1 and L2 flows into C2, the sum current flowing into the relative small capacitance of C2 causes it to charge to a high voltage and the values of the circuit components are so selected that, consistent with the diode D remaining conducting till the end of the trace current interval, C2 is charged to the peak of the oscillatory condition of the series circuit comprising L1C1 and C2 immediately before the next triggering signal is applied to controllable rectifier CR at the beginning of the next retrace current interval. Thus with C2 charged to this high voltage, the circuit conditions are returned at time *t6* the beginning of the retrace current interval to the conditions referred to at the beginning of this description, namely those at time *t1* and the deflection current cycle is repeated by supplying another triggering pulse to the control electrode terminal P of the controllable rectifier CP.

Figure 2:
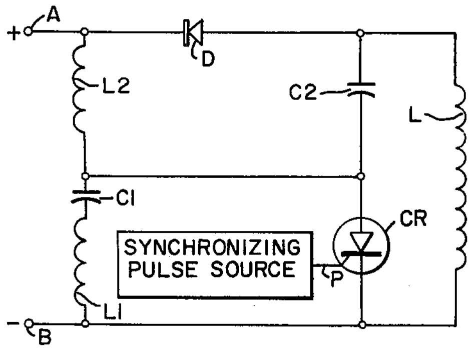
FIG. 2 is a schematic wiring diagram of a modified form of the invention.

Many modifications of the circuit arrangements shown in FIG. 1 within the scope of the present invention are possible. Thus, in FIG. 2 it will be seen that the junction of capacitor C2 and the controllable rectifier CR is connected as before to the junction of L2 and C1 but the other terminal of L1 is now connected to the negative source terminal instead of the positive source terminal. Again, the current in the controllable rectifier CR or the capacitor C2, as the case may be, is the sum current of the current in the non-oscillatory circuit L2 and the current in the oscillatory circuit of L1 and C1 during the linear portion of the trace current applied to deflection coil L.

Figure 3:
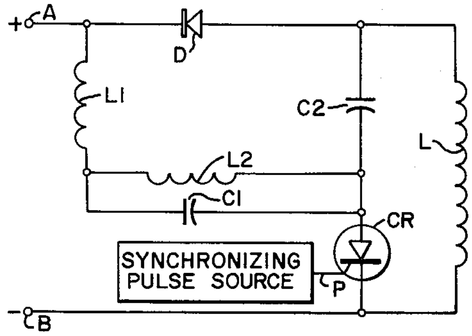
FIG. 3 is a schematic wiring diagram of another modification of the invention.

Referring to FIG. 3, it will be observed that the inductances L1 and L2 in this circuit arrangement are connected in series, C1 being connected in parallel with L2. During the linear portion of the trace current interval portion of current in deflection coil L, the current in controllable rectifier CR or capacitor C2, as the case may be, is the sum of the current in non-oscillatory circuit L2 and the oscillatory circuit L1C1. Thus the mode of operation of FIG. 3 is substantially the same as that of FIG. 1 or FIG. 2. Furthermore, in a minor modification of the arrangement of FIG. 3, the inductances L1 and L2 may be combined in a single inductance, C1 being connected across a portion of the single inductance.

Figure 4:
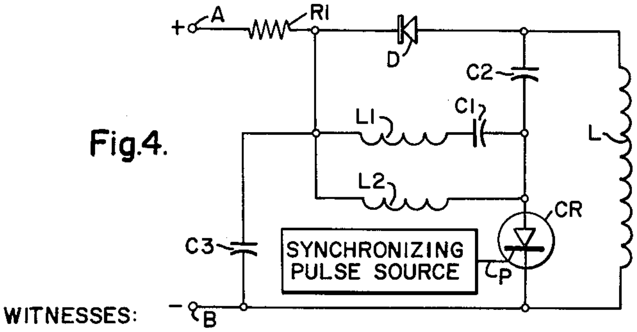
FIG. 4 is a schematic wiring diagram of yet another modification of the invention similar to FIG. 1 with the provision of a current limiting arrangement.

In the modification shown in FIG. 4, a current limiting resistor R1 is shown in series with the positive direct current supply terminal and between the junction of diode D and resistor R1 a storage capacitor C3 is connected to the negative supply terminal. Components R1 and C3 operate as fail-safe components. Thus if for some reason the controllable rectifier device CR fails to turn off, the excessive current in L2 is drawn from the storage capacitor C3 and the supply current is limited by the resistor R1. In normal operation the presence of resistor R1 does not cause any substantial power loss or disturbance of the circuit.

Figure 5:
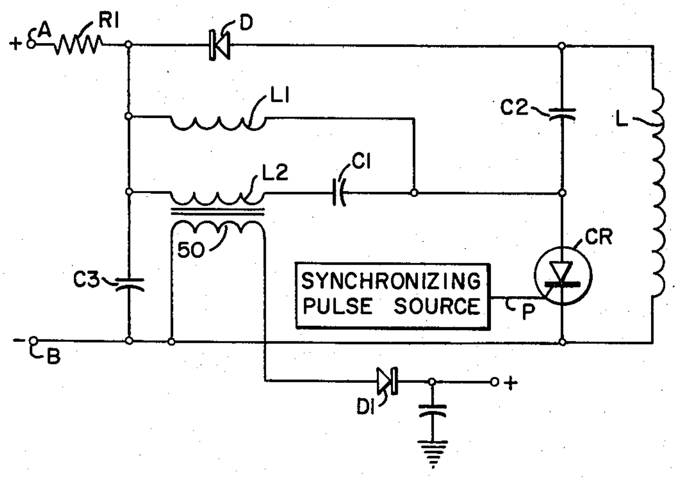
FIG. 5 is a schematic wiring diagram similar to FIG. 4 but including a high voltage source transformer.

Referring to the circuit arrangements shown in FIG. 5, in this circuit arrangement fail-safe components R1 and C3 are again included and also coupled with L2 there is a high voltage secondary winding 50 which is connected between the negative source terminal and a rectifier D1 to provide a high voltage output. The secondary winding may equally well be alternatively coupled to the inductance L1 if desired.

Figure 6:
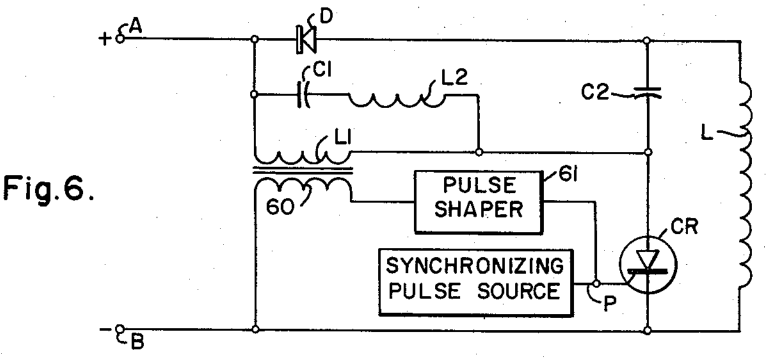
FIG. 6 is a schematic wiring diagram similar to FIG. 1 but including feedback connections for self-oscillation.

Referring to FIG. 6, this circuit arrangement shows a modification of the earlier circuit arrangements arranged to be self-oscillatory to dispense with the driving stage for the controllable rectifier and permit direct synchronization from a synchronizing pulse separator stage of the television receiver. For this purpose a secondary winding 60, one terminal of which is connected to the negative direct current terminal B, is coupled to the inductance L1 and the other terminal of the secondary winding is coupled via a pulse shaping network 61 to the triggering electrode of the controllable rectifier and to the synchronizing pulse source P.

Figure 7:
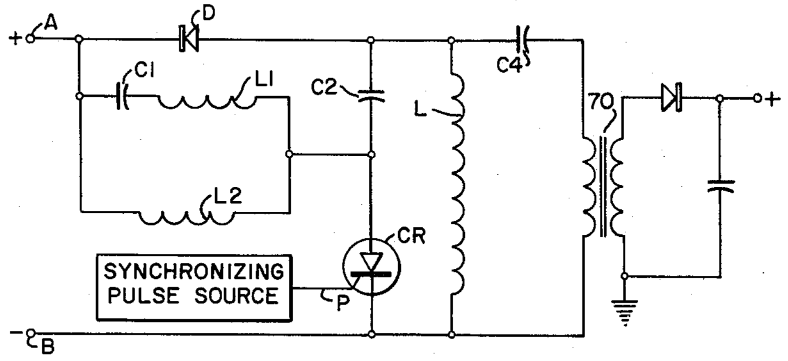
FIG. 7 is a schematic wiring diagram similar to FIG. 1 but showing a high voltage source transformer connected in parallel to the deflection coil.

In the circuit arrangement of FIG. 7, a high voltage transformer 70 is connected across the scanning yoke or deflection coil L of the receiver to provide a high voltage output. If desired a capacitor such as C4 may be connected between the primary winding of the high voltage transformer 70 and the deflection coil L to cause resonance with coil L to draw a large harmonic current from the supply. Thus the summation of currents in diode D may be modified to preserve the forward conduction if desired; this however is not essential.

Although the present invention has been described more specifically in relation to television horizontal deflection circuits, the invention is clearly not limited to such circuits and may be employed in other circuit arrangements where it is desired to provide switching-off of a controllable rectifier device without imposing a high transient voltage or current thereon.

I claim as my invention:

1. A deflection circuit comprising, a source of direct current, a deflection coil, a diode, means connecting said diode and said coil in series with each other and to said source, a capacitor, a controllable rectifier, means connecting said capacitor and said rectifier in series with each other and in parallel to said coil with said rectifier connected with reverse polarity to said diode in series with said source, the polarities of said diode and said rectifier relative to said source being such that said rectifier may be made conductive during the retrace current interval and said diode becomes conductive during the trace current interval of flow of deflection current through said coil, a source of turn-on drive voltage pulses, means connecting the voltage pulses from said drive voltage source to said controllable rectifier in a manner to cause said rectifier to become conductive at the beginning of each retrace current interval, an oscillatory circuit, a non-oscillatory circuit, and means connecting said oscillatory circuit to said non-oscillatory circuit and to said source and said controllable rectifier in a manner to reduce the holding current through said rectifier to below the holding current value to make said rectifier non-conductive while said diode is conducting to clamp said coil to said source of direct current during the trace current interval, the sum of the currents in said oscillatory and said non-oscillatory circuits combining with the deflection current in said coil during the trace current interval to maintain the deflection current substantially linear during the trace current interval.

2. A deflection circuit comprising, a source of direct current, a deflection coil, a diode, means connecting said diode and said coil in series with each other and to said source, a capacitor, a controllable rectifier, means connecting said capacitor and said rectifier in series with each other and in parallel to said coil with said rectifier connected with reverse polarity to said diode in series with said source, the polarities of said diode and said rectifier relative to said source being such that said rectifier may be made conductive during the retrace current interval and said diode becomes conductive during the trace current interval of flow of deflection current through said coil, a source of turn-on drive voltage pulses, means connecting the voltage pulses from said drive voltage source to said controllable rectifier in a manner to cause said rectifier to become conductive at the beginning of each retrace current interval, an oscillatory circuit including an inductor and a related capacitor, a non-oscillatory circuit including an inductor, and means connecting said oscillatory circuit to said non-oscillatory circuit and to said source and said controllable rectifier in a manner to reduce the holding current through said rectifier to below the holding current value to make said rectifier non-conductive while said diode is conducting to clamp said coil to said source of direct current during the trace current interval, the sum of the currents in said oscillatory and said non-oscillatory circuits combining with the deflection current in said coil during the trace current interval to maintain the deflection current substantially linear during the trace current interval.

3. A deflection circuit comprising, a source of direct current, a deflection coil, a diode, means connecting said diode and said coil in series with each other and to said source, a capacitor, a controllable rectifier, means connecting said capacitor and said rectifier in series with each other and in parallel to said coil with said rectifier connected with reverse polarity to said diode in series with said source, the polarities of said diode and said rectifier relative to said source being such that said rectifier may be made conductive during the retrace current interval and said diode becomes conductive during the trace current interval of flow of deflection current through said coil, a source of turn-on drive voltage pulses, means connecting the voltage pulses from said drive voltage source to said controllable rectifier in a manner to cause said rectifier to become conductive at the beginning of each retrace current interval, an oscillatory circuit including an inductor and series connected capacitor, a non-oscillatory circuit including an inductor, and means connecting said oscillatory circuit in parallel with said non-oscillatory circuit and in series with said source and said controllable rectifier in a manner to reduce the holding current through said rectifier to below the holding current value to make said rectifier non-conductive while said diode is conducting to clamp said coil to said source of direct current during the trace current interval, the sum of the currents in said oscillatory and said non-oscillatory circuits combining with the deflection current in said coil during the trace current interval to maintain the deflection current substantially linear during the trace current interval.

4. A deflection circuit comprising, a source of direct current, a deflection coil, a diode, means connecting said diode and said coil in series with each other and to said source, a capacitor, a controllable rectifier, means connecting said capacitor and said rectifier in series with each other and in parallel to said coil with said rectifier connected with reverse polarity to said diode in series with said source, the polarities of said diode and said rectifier relative to said source being such that said rectifier may be made conductive during the retrace current interval and said diode becomes conductive during the trace current interval of flow of deflection current through said coil, a source of turn-on drive voltage pulses, means connecting the voltage pulses, means connecting the voltage pulses from said drive voltage source to said controllable rectifier in a manner to cause said rectifier to become conductive at the biginning of each retrace current interval, an oscillatory circuit including an inductor and parallel connected capacitor, a non-oscillatory circuit including an inductor, and means connecting said oscillatory circuit in series with said non-oscillatory circuit and in series with said source and said rectifier in a manner to reduce the holding current through said rectifier to below the holding current value to make said rectifier non-conductive while said diode is conducting to clamp said coil to said source of direct current during the trace current interval, the sum of the currents in said oscillatory and said non-oscillatory circuits combining with the deflection current in said coil during the trace current interval to maintain the deflection current substantially linear during the trace current interval.

5. A deflection circuit comprising, a source of direct current, a deflection coil, a diode, means connecting said diode and said coil in series with each other and to said source, a capacitor, a controllable rectifier, means connecting said capacitor and said rectifier in series with each other and in parallel to said coil with said rectifier connected with reverse polarity to said diode in series with said source, the polarities of said diode and said rectifier relative to said source being such that said rectifier may be made conductive during the retrace current interval and said diode becomes conductive during the trace current interval of flow of deflection current through said coil, a source of turn-on drive voltage pulses, means connecting the voltage pulses from said drive voltage source to said controllable rectifier in a manner to cause said rectifier to become conductive at the beginning of each retrace current interval, an oscillatory circuit including an inductor and series connected capacitor, a non-oscillatory circuit including an inductor, means connecting said oscillatory circuit in series with said non-oscillatory circuit and in series with said source, and means connecting said rectifier to the junction of the series connected capacitor and inductor of said oscillatory circuit in a manner to reduce the holding current through said rectifier to below the holding current value to make said rectifier non-conductive while said diode is conducting to clamp said coil to said source of direct current during the trace current interval, the sum of the currents in said oscillatory and said non-oscillatory circuits combining with the deflection current in said coil during the trace current interval to maintain the deflection current substantially linear during the trace current interval.

6. The deflection circuit of claim 1 in which a current limiting resistance is connected in series with said diode and said source and a storage capacitor is connected in parallel to the circuit comprising said series connected diode and said deflection coil.

7. The deflection circuit of claim 3 in which the inductor of said oscillatory circuit is a transformer having a high voltage secondary winding.

8. The deflection circuit of claim 3 in which a high voltage supply transformer is connected in parallel with said deflection coil.

9. The deflection circuit of claim 8 in which a resonating capacitor is connected in series with said transformer and in parallel to said deflection coil.

10. The deflection circuit of claim 3 in which the inductor of said oscillatory circuit is a transformer having a secondary winding connected in feedback relation to said controllable rectifier and said source of turn-on drive voltage pulses to cause said deflection circuit to be self-oscillatory.

No references cited.

DAVID G. REDINBAUGH, *Primary Examiner.*

THOMAS A. GALLAGHER, *Assistant Examiner.*